(12) United States Patent
Greer et al.

(10) Patent No.: US 7,107,998 B2
(45) Date of Patent: Sep. 19, 2006

(54) METHOD FOR PREVENTING AND CLEANING RUTHENIUM-CONTAINING DEPOSITS IN A CVD APPARATUS

(75) Inventors: Harold F. R. Greer, San Francisco, CA (US); James A. Fair, Mountain View, CA (US); Junghwan Sung, Los Altos, CA (US); Nerissa Sue Draeger, Milpitas, CA (US)

(73) Assignee: Novellus Systems, Inc., San Jose, CA (US)

( * ) Notice: Subject to any disclaimer, the term of this patent is extended or adjusted under 35 U.S.C. 154(b) by 308 days.

(21) Appl. No.: 10/687,318

(22) Filed: Oct. 16, 2003

(65) Prior Publication Data

US 2005/0081882 A1   Apr. 21, 2005

(51) Int. Cl.
*B08B 9/00*   (2006.01)
*C23F 4/00*   (2006.01)

(52) U.S. Cl. .................. 134/22.1; 134/1.2; 216/67; 216/76; 438/720

(58) Field of Classification Search .............. 134/1.1, 134/1.2; 216/67, 76; 438/720
See application file for complete search history.

(56) References Cited

U.S. PATENT DOCUMENTS 5,372,849 A   12/1994   McCormick et al.
6,003,526 A * 12/1999   Lo et al. ................. 134/1.1
6,074,945 A    6/2000   Vaartstra et al.
6,537,461 B1 * 3/2003   Nakahara et al. ......... 216/67
2003/0037802 A1   2/2003   Nakahara et al.

OTHER PUBLICATIONS

Goodwin et al., "Reactive Metal Volatilization From Ru/Al2O3 As A Result Of Ruthenium Carbonyl Formation", Applied Catalysis, Apr. 1, 1986, pp. 199-209, vol. 24, Elsevier Science Publishers B.V., Amsterdam, The Netherlands.
Pan et al., "Reactive ion etching of RuO2 thin films using the gas mixture O2/CF3CFH2", J. Vac. Sci. Technol., Nov./Dec., 1994, pp. 3208-3213, vol. B 12, No. 8, American Vacuum Society.
Chandra et al., "Vapor Pressures of Osmium, Rhodium, and Ruthenium Carbonyls", Journal of Phase Equilibria, Jul. 6, 1999, pp. 565-572, vol. 20, No. 6.
Nakahara et al., "Etching technique for ruthenium with a high etch rate and high selectivity using ozone gas", J. Vac. Sci. Technol., Nov./Dec., 2001, pp. 2133-2136, vol. B 19, No. 6, American Vacuum Society.

* cited by examiner

*Primary Examiner*—Michael Barr
*Assistant Examiner*—Saeed Chaudhry
(74) *Attorney, Agent, or Firm*—Thomas Swenson

(57) ABSTRACT

Carbon monoxide gas is provided in a ruthenium-deposition apparatus to clean undesired ruthenium-containing deposits from apparatus surfaces. Carbon monoxide gas is mixed with reactant gases in apparatus tubing and in a ruthenium-deposition reaction chamber to inhibit formation of undesired ruthenium deposits on apparatus surfaces and to remove ruthenium deposits.

27 Claims, 4 Drawing Sheets

US 7,107,998 B2

METHOD FOR PREVENTING AND CLEANING RUTHENIUM-CONTAINING DEPOSITS IN A CVD APPARATUS

BACKGROUND OF THE INVENTION

1. Field of the Invention

This invention relates to the field of thermal reactors in integrated circuit fabrication, in particular, to the cleaning and purging of thermal reactors used for deposition of ruthenium metal and ruthenium compounds.

2. Statement of the Problem

Thin films of ruthenium, Ru, and ruthenium oxide, $RuO_2$, are useful in integrated circuit devices and in fabrication of integrated circuits. Ruthenium and ruthenium oxide are generally useful as electrical contact materials. They have good electrical conductivity and show good environmental stability. They are useful for contact metallizations, diffusion barriers, and gate metallizations. Ruthenium oxide electrodes have shown utility as working electrodes in non-aqueous solvents. Ruthenium and ruthenium oxide are useful as capacitor electrodes that remain electrically conductive even after exposure to oxidizing conditions.

A thin film of ruthenium metal deposited on a wafer substrate is useful as a seed layer on which copper is deposited by electrochemical or electroless chemical plating techniques. Deposition of copper wiring in integrated circuits involves a number of processes. Typically, a trench or hole is etched into dielectric material located on a substrate wafer. The hole or trench then is typically lined with one or several adhesion layers, for example, with tantalum nitride, TaN. The hole or trench then is lined with a thin layer of copper, Cu, that acts as a seed layer for electroplated copper. Thereafter, the hole or trench is filled with copper, typically by an electroplating process. In the past, adhesion layers and copper seed layers lining holes and trenches were deposited using conventional physical vapor deposition techniques. As the design density of integrated circuits increases, resulting in smaller dimensions of holes and trenches, it is generally more difficult to use physical vapor deposition to line holes and trenches with uniform and conformal thin films of integrated circuit material.

Thus, as the design density of integrated circuits increases, resulting in smaller design features and dimensions, deposition of ruthenium and ruthenium oxide thin films, as well as thin films of other materials, by physical vapor deposition techniques is often unsatisfactory for obtaining good quality, continuous, and conformal thin films. As a result, deposition of ruthenium metal, ruthenium oxide, and other metal compounds by chemical vapor deposition ("CVD") and atomic layer deposition ("ALD") is important for achieving good circuit quality and acceptable manufacturing yields.

Techniques for depositing ruthenium metal, ruthenium oxide, and other ruthenium compounds by CVD and ALD have been developed for forming thin films on a surface of a semiconductor substrate or substrate assembly, such as a silicon wafer, having significant surface-area topology, such as high-aspect-ratio openings. For example, U.S. Pat. No. 6,074,945, issued Jun. 13, 2000, to Vaartstra et al., U.S. Pat. No. 5,372,849, issued Dec. 13, 1994, to McCormick et al., and U.S. Patent Application Publication No. U.S. 2003/0037802 A1, published Feb. 27, 2003, naming Nakahara et al., which are hereby incorporated by reference, disclose methods and precursors for CVD deposition of ruthenium and ruthenium oxide on integrated circuit substrates. CVD techniques for depositing ruthenium or ruthenium oxide typically utilize a hot-substrate hot-wall reactor apparatus to avoid condensation of reactant precursors prior to their decomposition at the substrate surface. Nevertheless, various suitable reaction apparati also include cold-wall/hot-substrate reactors, radiation beam reactors, and plasma-and photo-assisted CVD reactors.

A common problem in CVD and in ALD reactor apparati, especially but not only in hot-wall reactors, is the undesired formation of a CVD film deposit on reactor walls, tubing walls, and other apparatus surfaces. As a result, periodic in situ cleaning of apparatus surfaces to remove the undesired deposits is necessary. If these chamber cleans are not performed, then solid deposits typically delaminate from the apparatus walls, leading to particle contamination of wafer surfaces. The presence of particles decreases circuit integrity and lowers manufacturing yields. In situ cleaning of CVD and ALD reaction chambers and apparatus surfaces typically is accomplished by introducing gas-phase species that react with an undesired film deposit to form a volatile product. For example, fluorine atoms generated in a remote plasma source react with solid TiN and solid TaN to form volatile $TiF_x$ and $TaF_x$ species, respectively, which desorb from a surface and are pumped away. In the case of Ru, however, Ru does not form volatile fluorides, chlorides, bromides, or iodides. U.S. Patent Application Publication No. U.S. 2003/0037802 A1, published Feb. 27, 2003, naming Nakahara et al., discloses a method for removing a deposit of ruthenium metal or an oxide of ruthenium from the surfaces of a CVD apparatus by combining etching techniques using an oxygen-atom donating gas to clean a low-temperature surface, and a halogen-containing gas to clean high-temperature surfaces. The oxygen-atom donating gas is preferably ozone, and a halogen-containing gas is, for example, hydrogen fluoride or chlorine fluoride. Activated oxygen species, such as O-radicals and ozone, react with Ru metal deposits to form $RuO_4$, an oxide of Ru that is volatile at room temperature. Nevertheless, $RuO_4$ is a highly reactive, toxic, and carcinogenic compound.

The problem of toxic byproducts is not unique. Many byproducts of chamber cleaning processes are toxic; for example, hydrogen fluoride, HF. Nevertheless, readily available techniques for detecting common toxic byproducts exist and are used. In the case of $RuO_4$, however, the toxicity problem is exacerbated because there is no practical and readily available method to detect this compound.

SUMMARY OF THE INVENTION

The present invention helps to solve some of the problems outlined above by providing methods for inhibiting the undesired formation of deposits of ruthenium metal or ruthenium-containing ("Ru-containing") compounds on the surfaces of CVD or ALD apparati. Further, the present invention helps to solve some of the problems outlined above by providing methods for in situ cleaning of a ruthenium deposition apparatus, whereby undesired deposits of ruthenium metal or ruthenium-containing compounds are cleaned from surfaces in CVD or ALD apparati, such as reaction chamber walls, inside walls of precursor gas tubing, inlet manifolds, and substrate holders.

Triruthenium dodecarbonyl and ruthenium pentacarbonyl are both volatile ruthenium compounds. It has been reported that Triruthenium dodecarbonyl has an equilibrium vapor pressure of 80 mTorr at 120° C. Prolonged exposure of Ru metal to carbon monoxide, CO, at temperatures ranging from 25° C. to 240° C. results in formation of both volatile species:

$$Ru_{(s)} + 5\ CO_{(g)} \rightleftharpoons Ru(CO)_{5(g)} \quad (1)$$

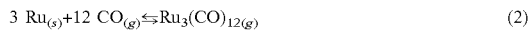

$$3\ Ru_{(s)} + 12\ CO_{(g)} \rightleftharpoons Ru_3(CO)_{12(g)} \quad (2)$$

Volatile ruthenium carbonyl compounds, such as $Ru(CO)_{5(g)}$ and $Ru_3(CO)_{12(g)}$, are relatively non-toxic and decompose thermally at room temperature to yield CO gas and ruthenium atoms, for which there is convenient disposal. Thus, a method using CO gas during a cleaning stage avoids formation of highly toxic, undetectable $RuO_4$ species in a ruthenium vapor-deposition reactor. Removal of a ruthenium-containing deposit by cleaning with CO gas as a reactant is significantly safer than using an oxygen radical or ozone during chamber cleaning.

The chemical reactions that form CVD or ALD thin films of ruthenium metal or ruthenium-containing compounds require that a gaseous ruthenium-containing precursor be present at sufficient concentration at the surface where deposition occurs. The deposition of a CVD thin film typically requires the presence of a plurality of gaseous chemical reactants at sufficient concentrations at the surface. Therefore, the deposition rate of ruthenium metal or ruthenium-containing compounds can be slowed or even stopped altogether by reducing the concentration (i.e., partial pressure) of one or more reactant gases in the vicinity of a surface. In certain embodiments in accordance with the invention, CO gas is selectively introduced near surfaces of an apparatus where deposition is undesirable. This reduces the deposition rate at apparatus surfaces, while not significantly affecting the desired deposition at a wafer substrate surface.

A method in accordance with the invention of cleaning a ruthenium-containing deposit from a surface of a ruthenium-deposition apparatus or inhibiting formation of a ruthenium-containing deposit on a surface of a ruthenium-deposition apparatus comprises providing carbon monoxide (CO) gas proximate to a surface of a ruthenium-deposition apparatus. In certain applications of the invention, this includes flowing carbon monoxide gas proximate to a ruthenium-containing deposit located on the surface. In one aspect of the invention, providing carbon monoxide gas comprises purging a ruthenium-deposition apparatus with carbon monoxide gas. In another aspect, providing carbon monoxide gas comprises mixing carbon monoxide gas with a vaporized ruthenium precursor in the ruthenium-deposition apparatus before, during, or after injecting the vaporized ruthenium precursor into a ruthenium-deposition reaction chamber In still another aspect, providing carbon monoxide gas comprises injecting carbon monoxide gas into an inlet tube of a reaction chamber while a vaporized ruthenium precursor is flowing through the tube. In another aspect, providing carbon monoxide gas comprises flowing carbon monoxide gas through a gas inlet nozzle into a chemical reaction chamber. In still another aspect, providing carbon monoxide gas comprises flowing carbon monoxide gas into a chemical reaction chamber proximate to a substrate holder. Preferably, a surface of a ruthenium-deposition apparatus is maintained at a temperature in a range of about from 150° C. to 250° C. in the presence of CO gas to inhibit or clean ruthenium-containing deposits.

Cleaning a ruthenium deposition apparatus and inhibiting deposition of a ruthenium-containing thin film using CO gas in accordance with the invention are advantageously integrated in a method for fabricating a ruthenium-containing thin film on integrated circuit substrates. A generalized method in accordance with the invention of fabricating a ruthenium-containing thin film on an integrated circuit substrate comprises inserting a substrate into a ruthenium-deposition reaction chamber, injecting a vaporized ruthenium precursor into the reaction chamber, injecting carbon monoxide (CO) gas into the reaction chamber, and then removing the substrate from the ruthenium-deposition reaction chamber. In certain embodiments, injecting carbon monoxide (CO) gas into the ruthenium-deposition reaction chamber includes substantially purging the vaporized ruthenium precursor from the reaction chamber with the carbon monoxide (CO) gas. Some embodiments in accordance with the invention include injecting carbon monoxide (CO) gas into the ruthenium-deposition reaction chamber concurrently with injecting vaporized ruthenium precursor into the reaction chamber. Some embodiments include continuously flowing the vaporized ruthenium precursor through the ruthenium-deposition reaction chamber. In certain embodiments, injecting carbon monoxide (CO) gas comprises continuously flowing carbon monoxide (CO) gas through the ruthenium-deposition reaction chamber. In some embodiments, ruthenium deposition includes substantially ceasing injecting vaporized ruthenium precursor before injecting carbon monoxide (CO) gas into the ruthenium-deposition reaction chamber. Typically, fabrication processes include conducting an inter-wafer purge by flowing carbon monoxide (CO) gas through the ruthenium-deposition reaction chamber after removing the substrate.

A generalized ALD fabrication process including inhibiting or cleaning a ruthenium-containing deposit in accordance with the invention typically comprises inserting a substrate into a ruthenium-ALD reaction chamber, injecting a vaporized ruthenium precursor into the ruthenium-ALD reaction chamber during a Ru-dosing stage, then injecting carbon monoxide (CO) gas into the ruthenium-ALD reaction chamber to purge the ruthenium precursor from the ruthenium-ALD reaction chamber, and thereafter injecting a surface-reactivation gas into the ruthenium-ALD reaction chamber during a surface reactivation stage. Preferably, an ALD process includes injecting carbon monoxide (CO) gas into the ruthenium-ALD reaction chamber during a purge stage to purge the surface-reactivation gas from the ruthenium-ALD reaction chamber. Some embodiments include mixing carbon monoxide gas with the vaporized ruthenium precursor before injecting the ruthenium precursor into the ruthenium-ALD reaction chamber. Certain embodiments include flowing carbon monoxide purge gas into the ruthenium-ALD reaction chamber at selected locations during the Ru-dosing stage. Some embodiments further comprise flowing carbon monoxide purge gas into the ruthenium-ALD reaction chamber at selected locations during the surface-reactivation stage.

BRIEF DESCRIPTION OF THE DRAWINGS

A more complete understanding of the invention may be obtained by reference to the drawings, in which.

DETAILED DESCRIPTION OF THE INVENTION

Figure 1:
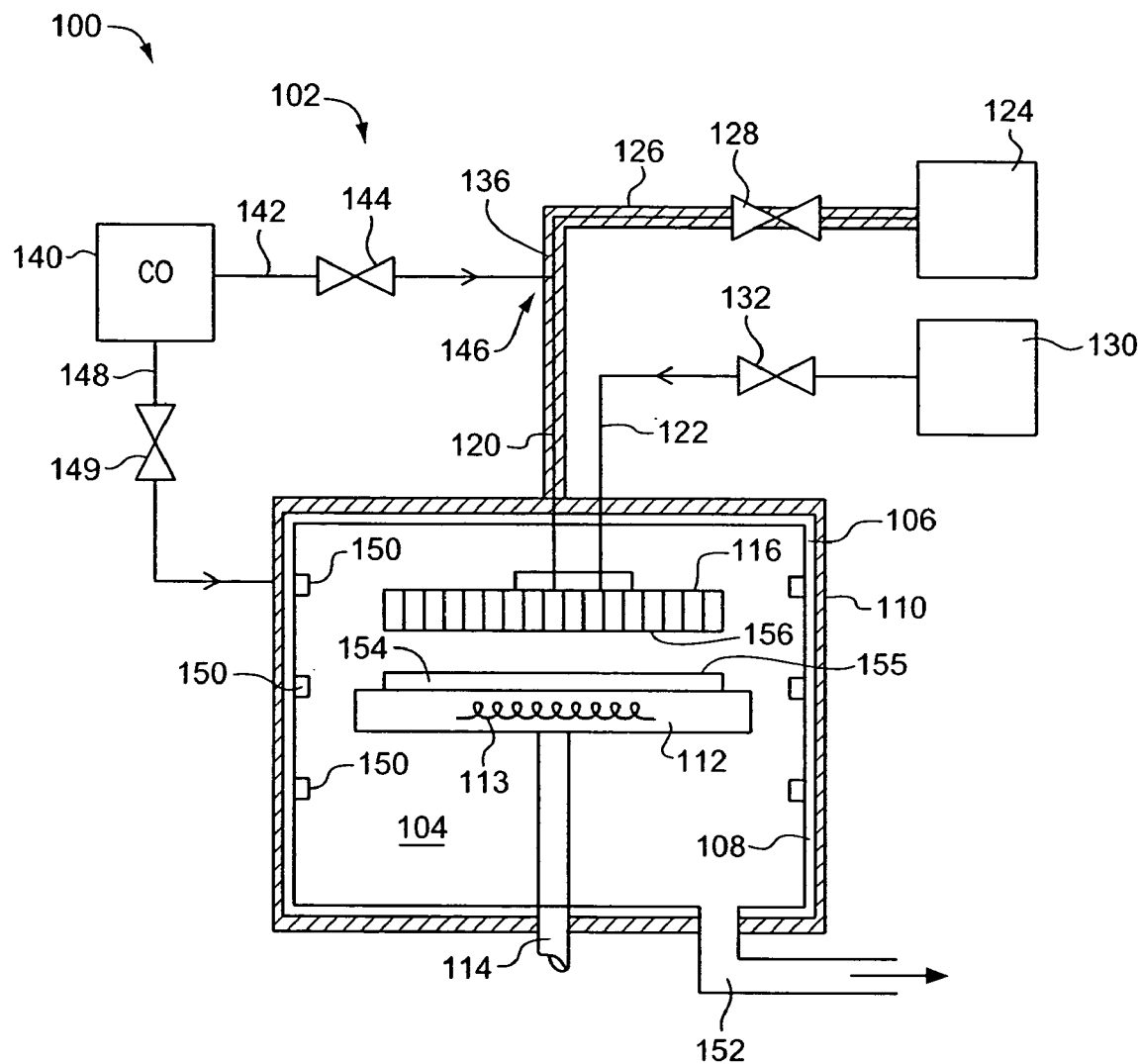
FIG. 1 schematically depicts a cross-sectional view of a CVD apparatus in which a method in accordance with the invention is practiced.
Figure 2:
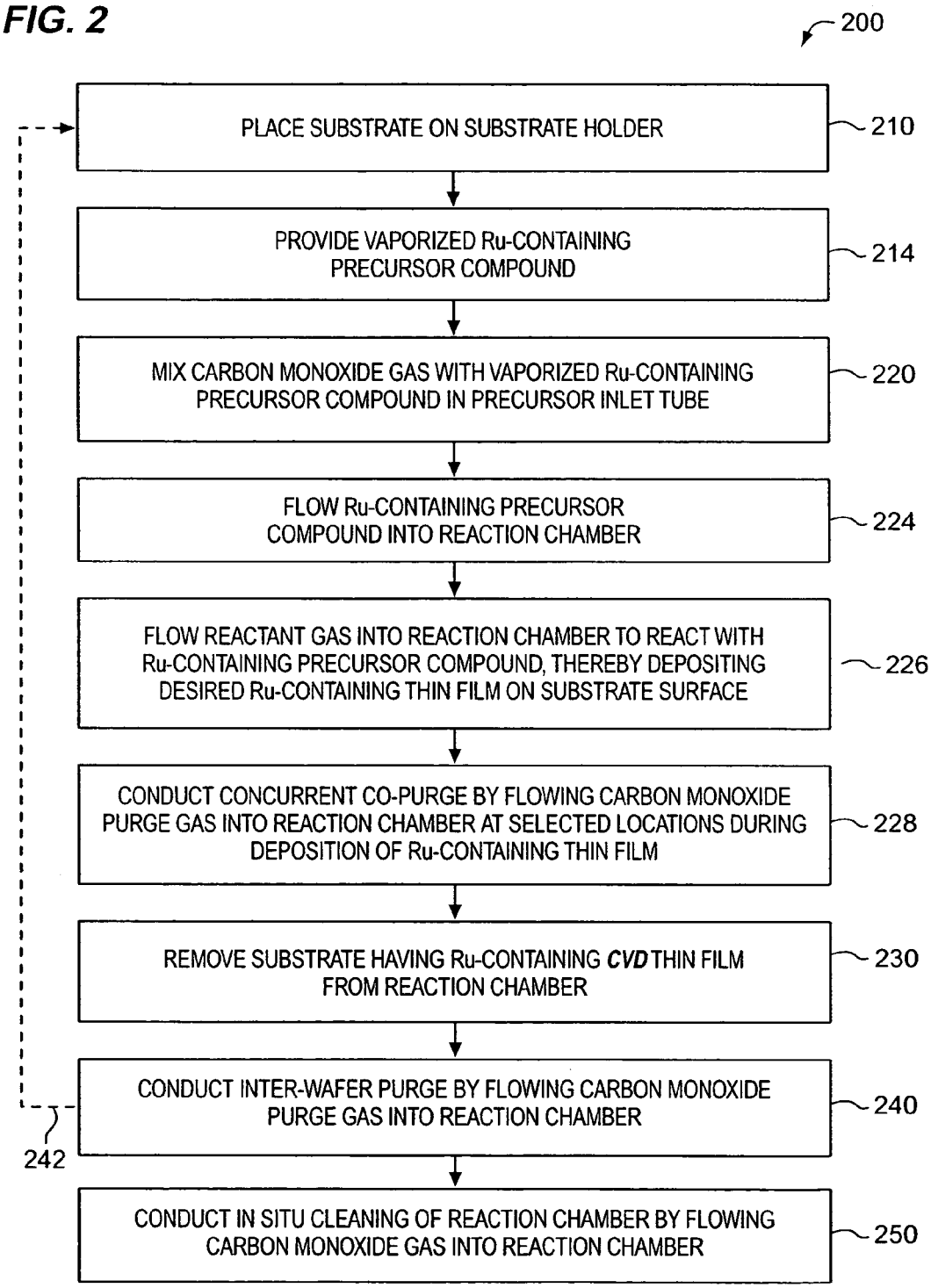
FIG. 2 contains a process flowsheet of a CVD method for depositing a Ru-containing thin film including purging and cleaning in accordance with the invention.
Figure 3:
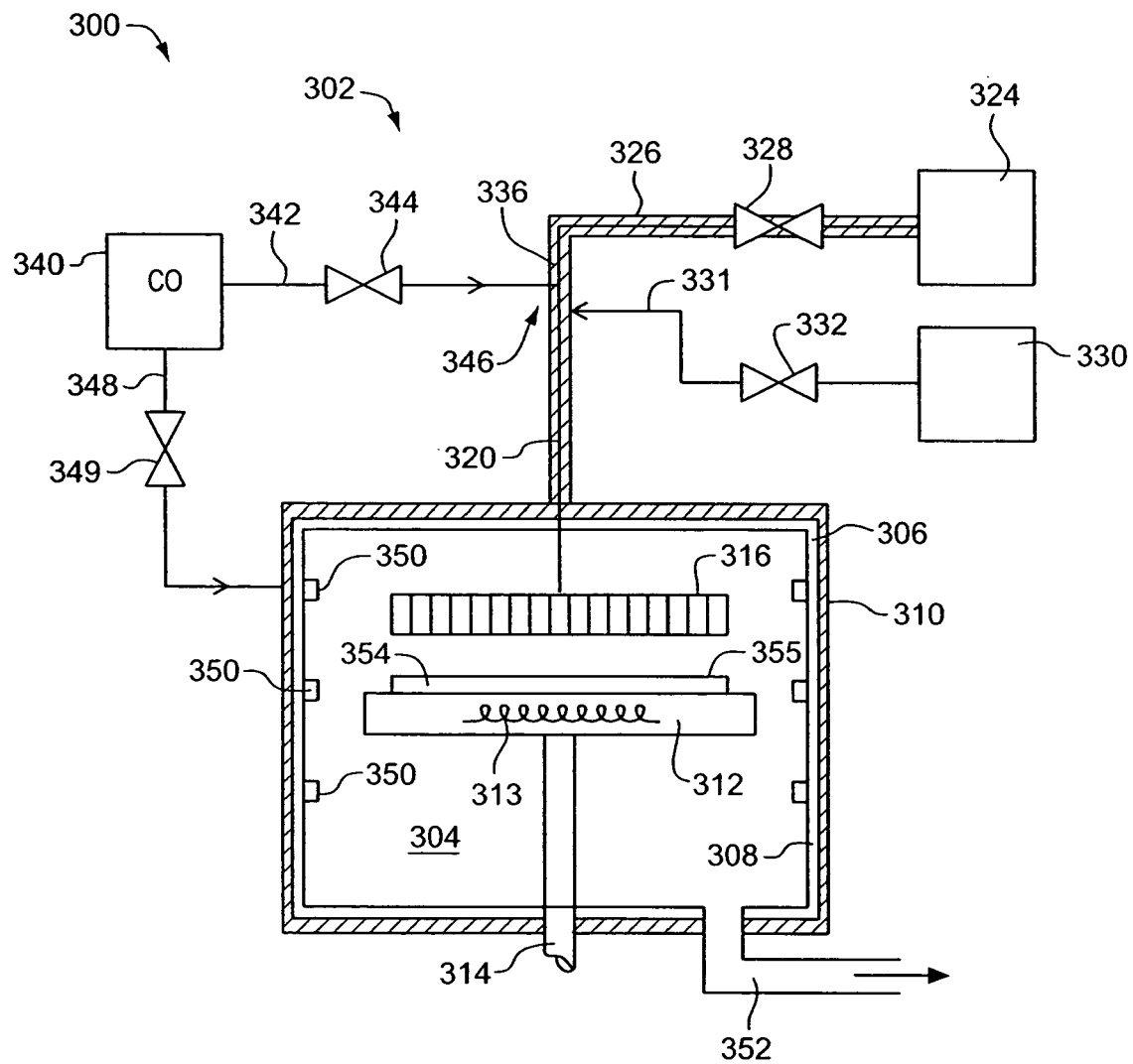
FIG. 3 depicts schematically a cross-sectional view of an ALD apparatus in which a method in accordance with the invention is practiced.

The invention is described herein with reference to FIGS. 1–4. It should be understood that the structures and systems depicted in schematic form in FIGS. 1 and 3 are used to explain the invention and are not precise depictions of actual structures and systems in accordance with the invention. Furthermore, processes are described in the specification with reference to FIGS. 1 and 3; nevertheless, it is clear that methods in accordance with the invention can be practiced using apparati very different from those of FIGS. 1 and 3. The preferred embodiments described herein are exemplary and are not intended to limit the scope of the invention, which is defined in the claims below.

Thin film deposition of Ru can be carried out in any one of a number of different vacuum chamber configurations. The preferred configuration is a vacuum chamber capable of processing a single wafer. FIG. 1 depicts schematically a cross-sectional view 100 of a CVD apparatus 102 in which a method in accordance with the invention is practiced. CVD apparatus 102 includes a reaction chamber 104 defined by a reactor vessel 106 having reactor vessel walls 108. In preferred embodiments, apparatus 102 includes reactor wall heater 110. CVD apparatus 102 further includes substrate holder 112 located in reaction chamber 104 and supported by a shaft 114 which can either be stationary or rotating. A showerhead-type gas inlet manifold 116 is also located in reaction chamber 104 proximate to substrate holder 112. Substrate holder 112 includes substrate heater 113, typically a resistive heater, for heating a substrate. CVD apparatus 102 includes a first gas inlet tube 120 and a second gas inlet tube 122. First gas inlet tube 120 is in fluidic communication with ruthenium precursor source 124 through precursor tube 126 and precursor control valve 128. Second gas inlet tube 122 is in fluidic communication with reactant gas source 130 through reactant gas control valve 132. Depending on a particular ruthenium precursor utilized in a method in accordance with the invention, ruthenium precursor source 124 comprises a solid volatilization chamber, a liquid vaporization chamber, a bubbling chamber connected to an inert gas source, or other device for generating a gasified ruthenium precursor compound. Generally, a gasified ruthenium precursor, either a pure vapor or a vapor carried in a carrier gas, is heated before entering reaction chamber 104. In preferred embodiments, precursor tube 126 and first inlet tube 120 are covered by precursor tube heater 136, which serves to preheat or maintain a desired temperature in first inlet tube 120 and also facilitates cleaning of ruthenium deposits from tubing walls at elevated temperature. Reactant gas source 130 typically provides oxidizer gas, for example, molecular oxygen gas, or a reducing gas, such as molecular hydrogen, depending on the composition of the ruthenium precursor compound and a desired reaction in reaction chamber 104. Typically, CVD apparatus 102 includes a reactant gas heater (not shown) to heat and to maintain temperature of the reactant gas from source 130.

In accordance with the invention, CVD apparatus 102 further comprises a carbon monoxide, CO, gas source 140 for providing CO gas used for cleaning ruthenium-containing deposits from apparatus surfaces, such as reactor vessel walls 108, substrate holder 112, showerhead 116, and tubing walls inside first inlet tube 120. CO gas source 140 also provides CO gas for purging ruthenium-containing precursor vapors out of first inlet tube 120, inlet manifold 116, and reaction chamber 104. First CO gas tubing 142 provides fluidic communication through first CO control valve 144 between CO gas source 140 and a T-junction 146 leading into first inlet tube 120. Typically, T-junction 146 is located downstream from precursor control valve 128. Preferably, as depicted in FIG. 1, CVD apparatus 102 includes second CO gas tubing 148, which provides fluidic communication through second CO control valve 149 between CO gas source 140 and purge gas nozzles 150. Purge gas nozzles 150 are disposed in CVD apparatus 102, particularly within reaction chamber 104, for providing CO gas to purge, or flush, ruthenium precursor compound out of apparatus 102 through exhaust 152 during a purge stage of a process. Alternatively, or additionally, purge gas nozzles 150 are disposed in apparatus 102 in order to flush precursor compound and reactant gas away from certain surfaces to avoid undesired deposition reaction and formation of ruthenium-containing deposits on apparatus surfaces while the desired CVD reaction is occurring at surface 155 of a substrate 154. Typically, reduced pressure in reaction chamber 104 and desired flow of gases through apparatus 102 is maintained using conventional techniques, generally using a turbo pump and a backing pump (not shown) connected to exhaust 152.

ALD apparati are well known in the art, and ALD apparati for practicing methods in accordance with the invention include modifications corresponding to those described with reference to FIG. 1, for example, a CO gas source 140.

Methods for depositing ruthenium, ruthenium oxide, and other ruthenium-containing compounds have become known in the art. For example, U.S. Pat. No. 6,074,945, issued Jun. 13, 2000, to Vaartstra et al., U.S. Pat. No. 5,372,849, issued Dec. 13, 1994, to McCormick et al., and U.S. Patent Application Publication No. U.S. 2003/0037802 A1, published Feb. 27, 2003, naming Nakahara et al., which are incorporated by reference, disclose methods and precursors for CVD deposition of ruthenium and ruthenium oxide on integrated circuit substrates.

Typically, a wafer substrate 154 enters the chamber via a port (not shown) on one side of reaction chamber 104 on a robot arm (not shown), and the wafer is placed on a heated substrate holder, or pedestal, 112. Once the wafer is placed, the robot arm retracts, and the entry port is closed. Before the arrival of the wafer, substrate holder 112 is resistively heated to a previously defined process temperature.

To initiate the ruthenium deposition process, reactive gases are introduced into the chamber above the wafer. This is typically performed using a dual-plenum showerhead that prevents the mixture of these gases until they arrive in the reactor above the wafer. The interaction of the reactive gases leads to the formation of a solid ruthenium film on all surfaces that are in contact with these gases, including, but not limited to, wafer substrate surface 155, the face plate 156 of showerhead 116, substrate holder 112, and walls 108 of reactor vessel 106.

The chemical reactions that form a Ru-containing thin film require both the gaseous Ru-containing precursor and the reactant gas, typically an oxidizer or hydrogen gas, to be present in significant quantities. Therefore, the deposition rate of Ru can be slowed or even stopped all together by reducing the amount of one or more of these gases (i.e., their partial pressure) in the vicinity of a substrate surface.

Selectively flowing a "purge" gas proximate to surfaces where deposition is undesirable, such as reaction chamber walls and a showerhead face plate, reduces the partial pressure of reactants in the vicinity of the surfaces without substantially decreasing the partial pressure near the substrate wafer surface. A concurrent purge of such surfaces is conducted by flowing purge-gas during deposition processes when reactive gases are also present in the deposition chamber. It is known to flow inert purge gases concurrently with deposition of thin films; for example, CVD deposition of tungsten (W) compounds and TiN. The concurrent flow of inert purge-gas changes the convective flow patterns of the gases in the chamber, causing the partial pressure of the Ru precursor and other reactant gases to be reduced in the vicinity of the chosen surfaces. This reduces the deposition rate on that surface, and thereby reduces the frequency with which an in-situ clean of the chamber must be performed.

Certain embodiments in accordance with the invention include flowing a reactive purge gas in addition to or instead of flowing an inert purge gas. CO gas reacts with solid Ru under certain conditions to yield a volatile solid $Ru_3CO_{12}$. At sufficiently high temperatures, solid $Ru_3CO_{12}$ evaporates, and is pumped away by the process pump along with excess reactants and reaction byproducts. By purging with CO during deposition, Ru-film deposits coating the chamber walls and other surfaces react with CO and are pumped away. This concurrent reactive purge gas technique complements the effect of an inert purge gas, not only slowing Ru deposition through reduced precursor/oxidizer concentration, but also by cleansing the walls by at least partially removing undesired film deposits. Preferably, the chamber walls and other surfaces to be cleaned are maintained at elevated temperatures in a range of about from 150° C. to 250° C. to make $Ru_3CO_{12}$ or other carbonyl sufficiently volatile to be pumped away.

It is important that a concurrent reactive purge gas technique not generate impurities within the growing film. In embodiments in accordance with the invention using reactive CO purge gas, $Ru_3CO_{12}$ potentially decomposes to Ru solid and CO gas, so there is no potential negative impact on desired Ru film properties on the substrate wafer. In contrast, halogens, which are known to etch many different materials, are unsatisfactory for a reactive purge.

Despite the presence of CO as a reactive purge gas for the reaction chamber walls, inlet tubing, inlet manifold (showerhead face plate), and substrate holder, Ru virtually inevitably deposits on surfaces that are difficult to purge. Therefore, in-situ apparatus cleaning is usually necessary, albeit less frequently than would be required without the CO chamber purges. General in situ apparatus cleans remove residual Ru films from chamber walls and other apparatus surfaces, minimizing the likelihood of generation of solid particles that contaminate wafer surfaces.

It is known in the prior art to combine a halogen-containing molecule, for example, containing fluorine, and an oxidizer to remove a Ru film. However, activated oxygen species, such as oxygen radicals and ozone, react with Ru metal deposits to form $RuO_4$, an oxide of Ru that is volatile at room temperature. Unfortunately, $RuO_4$ is a highly reactive, toxic, and carcinogenic compound. The problem of toxic byproducts is not unique as many chamber-clean byproducts are toxic (e.g., HF). Nevertheless, there are usually readily available techniques for detecting and disposing of these byproducts. In the case of $RuO_4$, however, the toxicity problem is exacerbated because there is no readily available and inexpensive method to detect and abate $RuO_4$.

In accordance with the invention, CO is utilized in place of a halogen/oxidizer mixture as the reactive gas used during in situ cleaning of CVD and ALD apparati.

FIG. 2 contains a process flowsheet of a CVD method 200 for depositing a Ru-containing thin film including purging and cleaning in accordance with the invention. Method 200 is described with reference to FIG. 1 depicting ruthenium-deposition CVD apparatus 102, although methods in accordance with the invention are practiced in numerous different CVD apparati. In processes 210, a substrate wafer 154 is mounted on substrate holder 112. In processes 214, a vaporized Ru-containing precursor compound is provided. Ru-containing precursor compounds suitable for depositing a thin film of Ru metal or Ru oxide or other Ru-containing solid thin film are known in the art. For example, Ru-containing precursor compounds are disclosed in U.S. Pat. No. 6,074,945, issued Jun. 13, 2000, to Vaartstra et al., U.S. Pat. No. 5,372,849, issued Dec. 13, 1994, to McCormick et al., and U.S. Patent Application Publication No. U.S. 2003/0037802 A1, published Feb. 27, 2003, naming Nakahara et al., which are incorporated by reference. A vaporized Ru-containing precursor is generated in Ru precursor source 124 using techniques known in the art; for example, by liquid bubbling or solid volatilization. In certain embodiments of methods for depositing a thin film of Ru metal (for example, a Ru seed layer), vaporized Ru carbonyl, $Ru_3CO_{12}$, is generated in precursor source 124 by volatilization of solid $Ru_3CO_{12}$ into a carrier gas. A carrier gas typically comprises a nonreactive gas, such as argon or nitrogen. In certain embodiments in accordance with the invention including concurrent reactive CO purge, a carrier gas comprises carbon monoxide gas, CO. Typically, Ru carbonyl is vaporized in precursor source 124 at a temperature in a range of about from 60° C. to 120° C. Dicyclopentadienyl ruthenium ("$RuCp_2$") is another Ru precursor compound suitable for depositing a thin film of Ru metal. Solid $RuCp_2$ is vaporized at a temperature in a range of about from 60° C. to 120° C. into a carrier gas, which may contain a nonreactive gas, such as argon and nitrogen, or reactive CO purge gas in accordance with the invention, or both nonreactive and CO gases. Ethyl dicyclopentadienyl ruthenium $(EtCp)_2Ru$ is another Ru precursor compound suitable for depositing a thin film of Ru metal. Liquid $(EtCp)_2Ru$ is vaporized by feeding neat $(EtCp)_2Ru$ into an evaporator at a temperature in a range of about from 100° C. to 130° C. or bubbling a carrier gas through the liquid, which carrier gas may contain a nonreactive gas, such as argon and nitrogen, or a reactive CO purge gas in accordance with the invention, or both nonreactive and CO gases. In embodiments including concurrent CO purge gas, CO gas alternatively or additionally flows during processes 220 from a CO source 140 through CO gas tubing 142 into first inlet tube 120 at T-junction 146.

In processes 224, a vaporized Ru-containing precursor flows from precursor source 124 through precursor control valve 128 and precursor tube 126 into first inlet tube 120 and then through dual plenum showerhead manifold 116 into single-substrate ruthenium-deposition reaction chamber 104, which typically has an enclosed volume of about 10 liters to 20 liters. In embodiments including concurrent CO purge gas, CO gas also flows through first inlet tube 120 mixed with Ru-containing precursor compound into manifold 116. The ratio of the flow rate of Ru-containing precursor compound in first inlet tube 120 relative to the combined flow rate of nonreactive carrier gas and CO purge gas is generally in a range of 5 to 1/200, typically about 1/25. In certain embodiments, a reactant gas, such as an oxidizer or a reducing gas, is not necessary and Ru precursor compound reacts in a desired CVD reaction at a heated substrate surface to deposit the desired Ru-containing thin film, such as a Ru seed layer. In typical embodiments, however, an oxidizing or reducing reactant gas is flowed into reaction chamber 104.

In processes 226, usually concurrently with processes 224, reactant gas flows from reactant gas source 130 through second inlet tube 122 into dual plenum showerhead manifold 116 into reaction chamber 104. In preferred embodiments in accordance with the invention, as described herein with reference to FIGS. 1 and 2, Ru-containing precursor compound in first inlet tube 120 flows through a first plenum of inlet manifold 116, and reactant gas in second inlet tube 122 flows through a second plenum of inlet manifold 116 so that the two gas streams of inlet tubes 120 and 122 do not mix until they enter reaction chamber 104 proximate to substrate surface 155 of a substrate 154. During processes 226, 228, vaporized Ru-containing precursor compound and reactant gas react in CVD reaction chamber 104 at substrate surface 155 depositing a solid thin film of Ru metal or other Ru-containing material, such as Ru oxide. Reactant gas flowing from reactant gas source 130 typically comprises an oxidizer gas or reducing hydrogen gas. A typical oxidizer gas comprises a strong oxidizer, such as molecular oxygen gas ($O_2$), ozone, and nitrogen oxide, $N_2O$. Ru carbonyl, $RU_3(CO)_{12(g)}$, reacts either with a reducing gas, such as $H_2$-gas, or with a strong oxidizer, such as $O_2$. In contrast, cyclopentadienyl precursor compounds react with an oxidizer gas only. During deposition of a Ru-containing thin film during processes 224, 226, reaction chamber 104 is typically maintained at a pressure in a range of about from 0.1 Torr to 10 Torr, preferably about 0.5 Torr. Also, substrate heater 113 is controlled to maintain substrate holder 112 at a temperature generally in a range of about from 200° C. to 400° C., typically about 350° C. The temperature of reactor walls 108 is typically maintained at a temperature in a range of about from 150° C. to 250° C. The flow rate of oxidizer gas (or reducing hydrogen gas) is generally in a range of about from 0 standard cubic centimeters per minute (sccm) to 1000 sccm, typically about 500 sccm. The ratio of the flow rate of the combined flow of vaporized Ru-containing precursor compound, nonreactive carrier gas, and CO purge gas in first inlet tube 120 relative to the flow rate of oxidizer (or hydrogen gas) in second inlet 122 is generally in a range of about 1:1 to 1:10, typically about 1:5. Under these conditions, the time required to deposit a desired Ru-containing thin film on a substrate is generally in a range of about from 20 seconds to 200 seconds, typically about 90 seconds. In this manner, a Ru-containing thin film having a uniform composition and a uniform thickness and conforming to topographical features of the substrate is deposited having a desired thickness of 5 nm or greater, typically in a range of about from 5 nm to 100 nm.

In some embodiments comprising concurrent reactive purging with CO gas, in processes 228, usually concurrent with processes 224, 226, CO purge gas is flowed into reaction chamber 104 through purge-gas valves 150 in addition to or alternatively to the flow of CO gas in first inlet tube 120. CO gas flowing through purge-gas valves 150 is used to reduce reactant concentration at certain surfaces, such as chamber walls 108, substrate holder 112, shaft 114, showerhead surfaces, and the wafer port (not shown). The flow rate of CO purge gas through each of one or several purge-gas valves 150 is generally in a range of about from 10 sccm to 1000 sccm, typically about 100 sccm. Processes 214–228 are generally conducted concurrently.

In processes 230, after deposition of a Ru-containing CVD thin film on a substrate surface 155, substrate 154 is removed from reaction chamber 104. In processes 240, before, after, or during processes 230, an inter-wafer purge of apparatus 100, in particular of reaction chamber 104, is conducted by flowing CO purge gas through reaction chamber 104 into exhaust drain 152, generally at a flow rate in a range of about from 100 sccm to 2000 sccm, generally about 1000 sccm, for a time generally in a range of about from 2 seconds to 30 seconds, typically about 5 seconds. Generally, an inter-wafer purge is conducted while maintaining approximately the same chamber pressure and temperature used during thin film deposition.

Subsequently, as indicated by dashed process-flow arrow 242, a new substrate is placed on substrate holder 112 and the CVD sequence is repeated.

After CVD treatment of a set number of wafer substrates, or as deemed necessary, an in situ cleaning of Ru is conducted in accordance with the invention in processes 250. Generally, an in situ clean using CO gas in accordance with the invention is conducted after CVD deposition of a Ru-containing thin film on from 200 wafer substrates to 10,000 wafer substrates, typically after thin film deposition on about 1000 substrates. During an in situ cleaning of Ru during processes 250, the surfaces being cleaned, such as chamber walls 106, the wafer port (not shown), and the inside of tubes 120, 126, are maintained at elevated temperature to ensure sufficient formation of $Ru_3(CO)_{12(g)}$, $Ru(CO)_{5(g)}$, or other Ru carbonyl for pumping away of the Ru carbonyl through exhaust drain 152. Typically, an elevated temperature in a range of about from 150° C. to 250° C. is maintained. The pressure during an in situ clean is generally greater than during CVD deposition. The pressure during an in situ cleaning is generally in a range of about from 0.1 Torr to 1000 Torr, typically about 100 Torr. CO cleaning gas is generally fed into apparatus 100 and reaction chamber 104 through tubing 142. CO cleaning gas is additionally or alternatively fed into reaction chamber 104 through purge-gas valves 150. The flow rate of CO cleaning gas during processes 250 is generally in a range of about from 100 sccm to 5000 sccm, typically about 1000 sccm, during a cleaning time generally in a range of about from 1 minute to 30 minutes, typically about 15 minutes.

The term "CVD" and related terms are used broadly in the specification to refer to any chemical deposition methods, apparati, and structures related to a reaction involving one or more gaseous chemical reactants that forms a Ru-containing thin film on a solid surface. As used in its broad sense, therefore, the term "CVD" and related terms include references to ALD-CVD, or simply ALD, methods, apparati, and structures. The term "CVD" is also used in the specification in a narrower sense to refer to methods, apparati, and structures related to the reaction of one or more gaseous chemical reactants that forms a ruthenium-containing thin film having a thickness substantially greater than an atomic monolayer ALD-film. The meanings of the term "CVD" and related terms are clear from the context in which the terms are used.

The term "Ru-containing" refers generally to a chemical species containing one or more ruthenium atoms. The term "Ru-containing", therefore, refers to pure ruthenium metal, as well as to compounds and species that contain ruthenium together with other chemical elements. For example, a ruthenium-containing thin film may comprise pure ruthenium metal, a ruthenium oxide, or another ruthenium-containing compound, depending on the context. The term "ruthenium-deposition apparatus" and similar terms refer generally to any apparatus used for deposition of a Ru-containing thin film. The terms "Ru", "ruthenium", "Ru-containing", and similar terms are often used synonymously.

For example, the terms "ruthenium precursor", "Ru-containing precursor", and similar terms are used synonymously to mean a precursor compound containing ruthenium atoms that is used in a CVD process to deposit Ru-containing thin film. It is clear, however, that the terms "Ru" and "ruthenium" are also used to refer to substantially pure ruthenium metal.

Carbon monoxide gas is used in accordance with the present invention as a purge gas to flush a ruthenium-deposition apparatus, as a concurrent reactive purge gas, during a CVD reaction, and as an in situ cleaning gas. The terms "purge", "cleaning", and related terms are used merely to describe the function of carbon monoxide gas in a particular context.

The terms "injecting", "providing", and related terms used with reference to a gas generally mean the injection of carbon monoxide or other gas into apparatus tubing or a chemical reaction chamber. In some embodiments in accordance with the invention, a process, such as a chemical reaction process, is conducted by flowing gas continuously through a chemical reaction chamber, with gas flowing in at an inlet flow rate and gas flowing out at an outlet flow rate. Typically, a continuous process is conducted at steady-state for at least a portion of the process duration. In other embodiments in accordance with the invention, a process is conducted in a substantially batch mode during at least a portion of the process duration. For example, in some embodiments, a reactant gas or a carbon monoxide cleaning gas is injected into a reaction chamber to fill the chamber at a particular process pressure, and then the flow of gas is substantially terminated. Therefore, injecting or providing a gas includes continuous flowing of gases as well as non-continuous injection of gases, and the meaning is clear from the context.

The term "proximate" with reference to providing carbon monoxide (CO) gas proximate to a surface of a ruthenium-deposition apparatus and similar contexts is a relative term understood by those skilled in the art. In such context, the term "proximate" means that CO gas is present in sufficient concentrations sufficiently close to a surface to effect removal of a ruthenium-containing deposit from the surface or to inhibit formation of a ruthenium-containing deposit at the surface. The ranges of operating pressures and flow rates of CO gas and other gasses disclosed in this specification, which generally provide sufficient concentration of CO gas proximate to apparatus surfaces, are exemplary rather than limiting.

FIG. 3 depicts schematically a cross-sectional view 300 of an ALD apparatus 302 in which a method in accordance with the invention is practiced. ALD apparatus 302 includes an ALD reaction chamber 304 defined by a reactor vessel 306 having reactor vessel walls 308. In preferred embodiments, apparatus 302 includes reactor wall heater 310. ALD apparatus 302 further includes substrate holder 312 located in reaction chamber 304 and supported by a shaft 314. A showerhead-type gas inlet manifold 316 is also located in reaction chamber 304 proximate to substrate holder 312. Substrate holder 312 includes substrate heater 313, typically a resistive heater, for heating a substrate. ALD apparatus 302 includes a gas inlet tube 320. Gas inlet tube 320 is in fluidic communication with ruthenium precursor source 324 through precursor tube 326 and precursor control valve 328. Gas inlet tube 320 is also in fluidic communication with surface-reactivation gas source 330 through reactivation-gas tube 331 and reactivation-gas control valve 332. Depending on a particular ruthenium precursor utilized in a method in accordance with the invention, ruthenium precursor source 324 comprises a solid volatilization chamber, a liquid vaporization chamber, a bubbling chamber connected to an inert gas source, or other device for generating a gasified ruthenium precursor compound. Generally, a gasified ruthenium precursor, either a pure vapor or a vapor carried in a carrier gas, is heated before entering reaction chamber 304. In preferred embodiments, precursor tube 326 and inlet tube 320 are covered by precursor tube heater 336, which serves to preheat or maintain a desired temperature in first inlet tube 320 and also facilitates cleaning of ruthenium deposits on tubing walls at elevated temperature. Reactivation-gas source 330 typically provides oxidizer gas, for example, molecular oxygen gas, or a reducing gas, such as molecular hydrogen, depending on the composition of the ruthenium precursor compound, a desired reaction in reaction chamber 304, and the composition of the substrate surface after deposition of an ALD monolayer during an ALD deposition cycle. Typically, ALD apparatus 302 includes a reactivation-gas heater (not shown) to heat and to maintain temperature of the reactivation gas.

In accordance with the invention, ALD apparatus 302 further comprises a carbon monoxide, CO, gas source 340 for providing CO gas used for cleaning ruthenium-containing deposits from apparatus surfaces, such as reactor vessel walls 306, substrate holder 312, showerhead 316, tubing walls inside gas inlet tube 320, and the wafer inlet port (not shown). CO gas source 340 also provides CO gas for successively purging ruthenium-containing precursor vapors and reactivation-gas out of inlet tube 320, inlet manifold 316, and reaction chamber 304. First CO gas tubing 342 provides fluidic communication through first CO control valve 344 between CO gas source 340 and a T-junction 346 leading into gas inlet tube 320. Typically, T-junction 346 is located to maximize effective purging of precursor and other gases from gas inlet tube 320. Preferably, as depicted in FIG. 3, ALD apparatus 302 includes second CO gas tubing 348, which provides fluidic communication through second CO control valve 349 between CO gas source 340 and purge-gas nozzles 350. Purge-gas nozzles 350 are disposed in ALD apparatus 302, particularly within reaction chamber 304, for providing CO gas to purge, or flush, ruthenium precursor compound out of apparatus 302 through exhaust 352 during a purge stage of a process. Alternatively, or additionally, purge-gas nozzles 350 are disposed in apparatus 302 in order to flush precursor compound and reactant gas away from certain surfaces to avoid undesired deposition reactions and formation of ruthenium-containing deposits on apparatus surfaces while a desired ALD reaction is occurring at the surface of a substrate 354. Typically, reduced pressure in reaction chamber 304 and desired flow of gases through apparatus 302 are maintained using conventional techniques, generally using a turbo pump and a backing pump (not shown) connected to exhaust 352.

Typically, a wafer substrate 356 enters the chamber via a port (not shown) on one side of reaction chamber 304 on a robot arm (not shown), and the wafer is placed on a heated substrate holder, or pedestal, 312. Once the wafer is placed, the robot arm retracts, and the entry port is closed. Before the arrival of the wafer, substrate holder 312 is resistively heated to a previously defined process temperature.

An ALD deposition cycle of a conventional representative ALD method for depositing a ruthenium-containing thin film includes four stages: a ruthenium-containing precursor dosage; a first, post-precursor inert-gas purge stage; a surface-reactivation stage, in which an oxidizer or reducing agent treats the substrate surface to make it again reactive with the ruthenium-containing precursor; and a second, post-reactivation inert-gas purge stage. Typically, an ALD deposition cycle is repeated hundreds or thousands of times to deposit a conformal thin film of ruthenium-containing material having a desired thickness.

Figure 4:
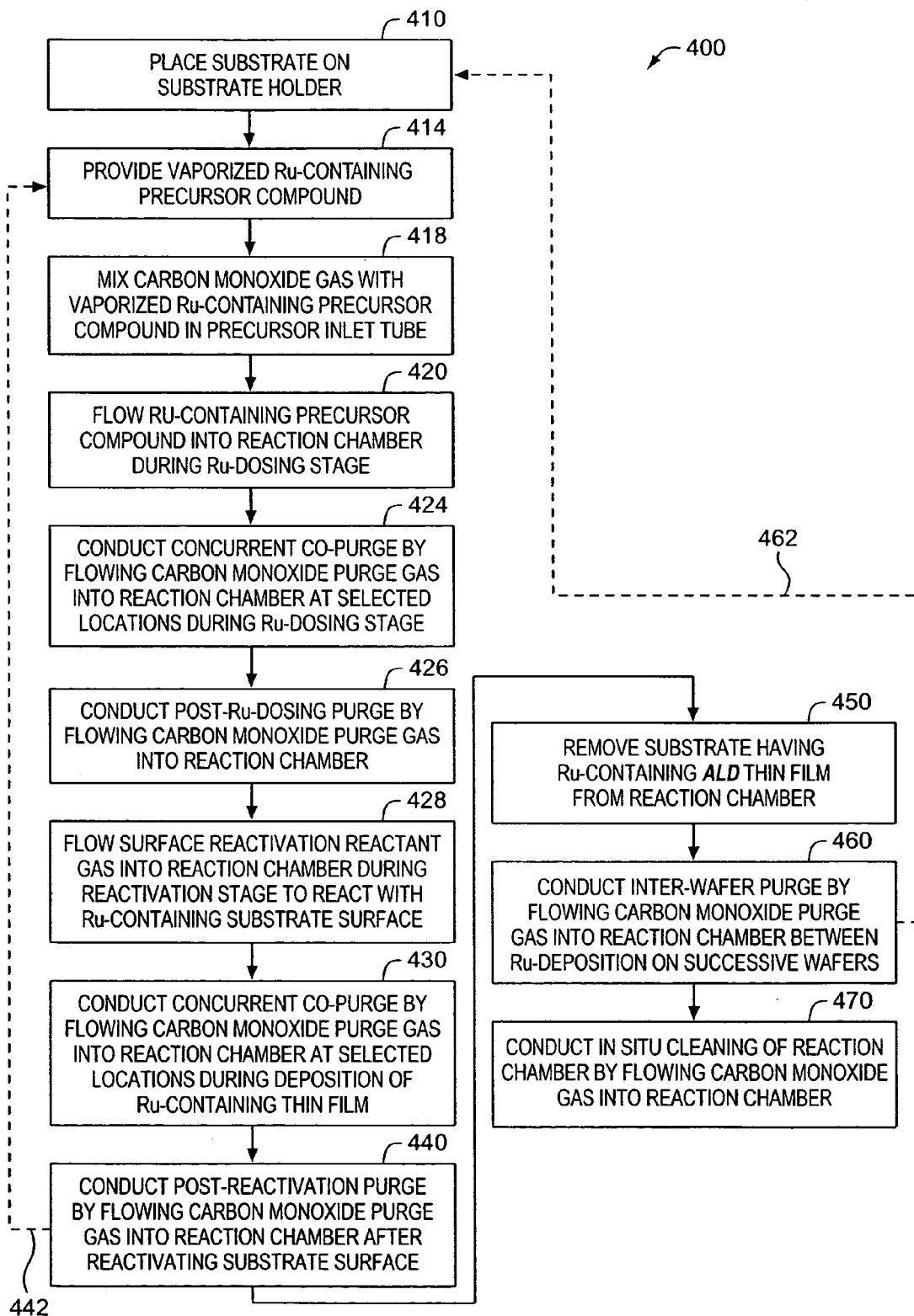
FIG. 4 contains a process flowsheet of an ALD method for depositing a Ru-containing thin film including purging and cleaning in accordance with the invention.

FIG. 4 contains a process flowsheet of an ALD method 400 for depositing a Ru-containing thin film including purging and cleaning in accordance with the invention. Method 400 is described with reference to FIG. 3 depicting ruthenium-deposition ALD apparatus 302, although methods in accordance with the invention are practiced in numerous different ALD apparati. In processes 410, a substrate wafer 354 is mounted on substrate holder 312. In processes 414, a vaporized Ru-containing precursor compound is provided. Ru-containing precursor compounds suitable for depositing an ALD atomic monolayer of Ru metal or Ru oxide or other Ru-containing solid compound are known in the art. A vaporized Ru-containing precursor is generated in Ru precursor source 324 using techniques known in the art; for example, by liquid bubbling or solid volatilization. In certain embodiments of methods for depositing a thin film of Ru metal, for example, a Ru seed layer, vaporized Ru carbonyl, $Ru_3(CO)_{12(g)}$, is generated in precursor source 324 by volatilization of solid $Ru_3(CO)_{12}$ into a carrier gas. A carrier gas typically comprises a nonreactive gas, such as argon or nitrogen. In certain embodiments in accordance with the invention including concurrent reactive CO purge, a carrier gas comprises carbon monoxide gas, CO. Typically, Ru carbonyl is vaporized in precursor source 324 at a temperature in a range of about from 60° C. to 120° C. Dicyclopentadienyl ruthenium ($RuCp_2$) is another Ru precursor compound suitable for depositing a thin film of Ru metal. Solid $RuCp_2$ is vaporized at a temperature in a range of about from 60° C. to 120° C. into a carrier gas, which may contain a nonreactive gas, such as argon and nitrogen, or reactive CO purge gas in accordance with the invention, or both nonreactive and CO gasses. Ethyl dicyclopentadienyl ruthenium $(EtCp)_2Ru$ is another Ru precursor compound suitable for depositing Ru metal. Liquid $(EtCp)_2Ru$ is vaporized by feeding neat $(EtCp)_2Ru$ into an evaporator at a temperature in a range of about from 100° C. to 130° C. and bubbling a carrier gas through the liquid, which carrier gas may contain a nonreactive gas, such as argon and nitrogen, or reactive CO purge gas in accordance with the invention, or both nonreactive and CO gasses.

In processes 420, a ruthenium-dosing stage is conducted by injecting vaporized Ru-containing precursor compound into ruthenium-ALD reaction chamber 304 proximate to wafer surface 355, which has been previously activated to facilitate the desired ALD reaction at surface 355. In embodiments of the invention including concurrent CO purge gas, CO gas alternatively or additionally flows in processes 424, concurrent with processes 420, from a CO source 340 through CO gas tubing 342 into gas inlet tube 320 at T-junction 346. Alternatively, or additionally, CO gas flows through purge-gas tubing 348 into reaction chamber 304 through purge-gas valves 350 during processes 424. Processes 414-424 in FIG. 4 generally are conducted substantially concurrently.

In processes 426, a post-precursor purge stage is conducted by flowing CO purge gas into reaction chamber 304 through CO tubing 342, gas inlet tubing 320, and inlet manifold 316, and typically also by flowing CO purge gas through purge-gas valves 350.

In processes 428, surface-reactivation gas flows into reaction chamber 304 during a surface-reactivation stage in which the reactivation gas reacts with Ru-containing substrate surface 355, thereby making substrate surface 355 again reactive with the Ru precursor.

In processes 430, concurrent with processes 428, a concurrent reactive CO purge is conducted by flowing CO purge gas into reaction chamber 304 through one or several of inlet tubes 320 and purge-gas valves 350 to inhibit formation of undesired Ru deposits in reaction chamber 304.

Following surface reactivation, a post-reactivation purge stage is conducted in processes 440 by flowing CO purge gas through gas inlet tube 320 and inlet manifold 316. Optionally, CO purge gas is also introduced through purge-gas valves 350 into reaction chamber 304 during processes 440.

As indicated by process flow arrow 442 in FIG. 4, the ALD deposition cycle of processes 414-440 is repeated until a ruthenium-containing thin film having a desired thickness is obtained. In processes 450, then, substrate 354 having a desired ALD thin film is removed from reaction chamber 304.

In processes 460, an inter-wafer purge is conducted by flowing CO purge gas into reaction chamber 304. As indicated by process flow arrow 462, processes 410-460 are repeated to form a Ru-containing ALD thin film on another substrate.

After ALD treatment of a set number of wafer substrates, or as deemed necessary, an in situ cleaning of Ru is conducted in accordance with the invention in processes 470. Generally, an in situ clean using CO gas in accordance with the invention is conducted after ALD deposition of a Ru-containing thin film on from 200 wafer substrates to 10,000 wafer substrates, typically after thin film deposition on about 1000 substrates. During an in situ cleaning of Ru during processes 470, the surfaces being cleaned, such as chamber walls 306 and the inside of tubes 320, 326, are maintained at elevated temperature to ensure sufficient volatilization of $Ru_3(CO)_{12(g)}$ or other ruthenium carbonyl for its pumping away through exhaust drain 352. Typically, an elevated temperature in a range of about from 150° C. to 250° C. is maintained. The pressure during an in situ cleaning is generally greater than during ALD deposition. The pressure during an in situ cleaning is generally in a range of about from 0.1 Torr to 1000 Torr, typically about 100 Torr. CO cleaning gas is generally fed into apparatus 300 and reaction chamber 304 through tubing 342. CO cleaning gas is additionally, or alternatively, fed into reaction chamber 304 through purge-gas valves 350. The flow rate of CO cleaning gas during processes 470 is generally in a range of about from 100 sccm to 5000 sccm, typically about 1000 sccm, during a cleaning time generally in a range of about from 1 minute to 30 minutes, typically about 15 minutes.

The particular systems, designs, methods, and compositions described herein are intended to illustrate the functionality and versatility of the invention, but should not be construed to be limited to those particular embodiments. Systems and methods in accordance with the invention are useful in a wide variety of circumstances and applications to prevent and clean ruthenium-containing deposits in ruthenium-deposition apparati. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

The invention claimed is:

1. A method of cleaning a ruthenium-containing deposit from a ruthenium-deposition apparatus, comprising processes of:
   providing carbon monoxide (CO) gas in at least a portion of said ruthenium-deposition apparatus during cleaning; and
   during cleaning, maintaining at least said portion substantially free of an activated oxygen species and an oxygen-atom donating gas.

2. A method as in claim 1, further comprising:
   avoiding formation of $RuO_4$.

3. A method as in claim 1 wherein:
   said maintaining at least said portion substantially free comprises purging at least said portion with a purge gas comprising CO; and
   wherein said purge gas contains substantially no oxygen-containing oxidizing species except carbon monoxide.

4. A method as in claim 1 wherein:
   said maintaining at least said portion substantially free comprises supplying during cleaning in said portion substantially no species selected from the group consisting of ozone, radical oxygen, a halogen-containing species, nitrogen oxide, and an activated oxygen species.

5. A method as in claim 4, further comprising:
   during cleaning, maintaining at least said portion substantially free of a strong oxidizer.

6. A method as in claim 1 wherein:
   said ruthenium-deposition apparatus comprises at least a portion selected from the group consisting of a ruthenium-deposition reaction chamber, a ruthenium-precursor inlet tube, an inlet manifold, and a reaction-chamber exhaust.

7. A method as in claim 1, further comprising:
   maintaining the temperature of at least said portion of said ruthenium-deposition apparatus in a range of about from 150° C. to 250° C.

8. A method of cleaning a ruthenium-containing deposit from a ruthenium-deposition apparatus, comprising processes of:
   providing carbon monoxide gas in at least a portion of said ruthenium-deposition apparatus; and
   avoiding formation of $RuO_4$.

9. A method as in claim 8, wherein said avoiding formation of $RuO_4$ comprises:
   during cleaning, maintaining at least said portion substantially free of an activated oxygen species and an oxygen-atom donating gas.

10. A method as in claim 9, wherein:
    said providing carbon monoxide gas in at least said portion comprises flowing carbon monoxide gas through said portion; and
    said avoiding formation of $RuO_4$ comprises supplying during cleaning in said portion substantially no species selected from the group consisting of ozone, radical oxygen, halogen-containing species, nitrogen oxide, and an activated oxygen species.

11. A method as in claim 10, wherein said avoiding formation of $RuO_4$ further comprises:
    maintaining during cleaning at least said portion substantially free of a strong oxidizer.

12. A method as in claim 8, further comprising:
    during cleaning, maintaining at least said portion substantially free of a ruthenium-containing precursor.

13. A method of inhibiting formation of a ruthenium-containing deposit on an apparatus surface of a ruthenium-deposition apparatus during deposition of a ruthenium-containing film on a wafer substrate, comprising:
    providing a ruthenium-containing precursor gas proximate to a wafer substrate surface in a ruthenium-deposition apparatus to deposit a ruthenium-containing film on said wafer substrate surface; and
    providing carbon monoxide (CO) gas proximate to an apparatus surface of said ruthenium-deposition apparatus during said providing said ruthenium-containing precursor gas proximate to said wafer substrate surface.

14. A method as in claim 13, further comprising:
    avoiding formation of $RuO_4$.

15. A method as in claim 13, further comprising:
    maintaining said apparatus proximate to said apparatus surface substantially free of an activated oxygen species and an oxygen-atom donating gas.

16. A method as in claim 15 wherein:
    said providing carbon monoxide gas proximate to said apparatus surface comprises flushing said surface with carbon monoxide gas; and
    said maintaining said apparatus proximate to said apparatus surface substantially free comprises supplying proximate to said apparatus surface substantially no species selected from the group consisting of ozone, radical oxygen, halogen-containing species, nitrogen oxide and activated oxygen species.

17. A method as in claim 16 wherein said maintaining said apparatus proximate to said apparatus surface substantially free further comprises:
    supplying proximate to said apparatus surface substantially no strong oxidizer.

18. A method as in claim 13 wherein:
    said ruthenium-deposition apparatus comprises a ruthenium-deposition reaction chamber and a ruthenium-precursor inlet tube having inlet tube wall surfaces; and
    said providing carbon monoxide gas comprises flowing carbon monoxide gas through said ruthenium-precursor inlet tube while flowing a ruthenium-containing precursor gas through said ruthenium-precursor inlet tube.

19. A method as in claim 18 wherein:
    said flowing carbon monoxide gas through said ruthenium-precursor inlet tube comprises flowing a carrier gas comprising carbon monoxide at a carrier gas flow rate;
    said flowing a ruthenium-containing precursor gas comprises flowing a ruthenium-containing precursor gas at a ruthenium precursor flow rate; and
    a ratio of said ruthenium precursor flow rate divided by said carrier gas flow rate has a value in a range of about from 1/5 to 1/100.

20. A method as in claim 19, further comprising:
    flowing a reactant gas at a reactant gas flow rate through a reactant inlet tube, said reactant gas comprising a gas selected from the group consisting of a strong oxidizer and a reducing gas; and wherein:
    said flowing said carrier gas and said ruthenium-containing precursor gas through said ruthenium precursor inlet tube comprises flowing said carrier gas and said ruthenium-containing precursor gas at a combined flow rate; and a ratio of said combined flow rate divided by said reactant gas flow rate flow rate has a value in a range of about from 1/1 to 1/10.

21. A method as in claim 13 wherein:

said ruthenium-deposition apparatus comprises a ruthenium-deposition reaction chamber and an inlet manifold connected to said reaction chamber; and said providing carbon monoxide gas comprises flowing carbon monoxide gas through said inlet manifold while flowing a ruthenium-containing precursor gas through said inlet manifold.

22. A method as in claim 13, further comprising:

maintaining said apparatus proximate to said apparatus surface substantially free of a ruthenium-containing precursor gas.

23. A method as in claim 22 wherein:

said ruthenium-deposition apparatus comprises a ruthenium-deposition reaction chamber and a substrate holder having a substrate holder surface located in said reaction chamber; and said providing carbon monoxide gas comprises flushing said substrate holder surface with carbon monoxide gas while providing a ruthenium-containing precursor gas in said reaction chamber.

24. A method as in claim 22 wherein:

said ruthenium-deposition apparatus comprises a ruthenium-deposition reaction chamber having reaction chamber walls; and said providing carbon monoxide gas comprises flushing said reaction chamber walls with carbon monoxide gas while providing a ruthenium-containing precursor gas in said reaction chamber.

25. A method as in claim 13, further comprising:

maintaining said apparatus proximate to said apparatus surface substantially free of a reducing agent.

26. A method as in claim 13, wherein said providing carbon monoxide (CO) gas proximate to an apparatus surface comprises:

providing substantially no oxygen-containing oxidizing species except carbon monoxide proximate to said apparatus surface.

27. A method as in claim 13, further comprising:

maintaining the temperature of said apparatus surface in a range of about from 150° C. to 250°C.

* * * * *